US006045932A

United States Patent [19]

Jia et al.

[11] Patent Number: 6,045,932

[45] Date of Patent: Apr. 4, 2000

[54] FORMATION OF NONLINEAR DIELECTRIC FILMS FOR ELECTRICALLY TUNABLE MICROWAVE DEVICES

[75] Inventors: Quanxi Jia; Alp T. Findikoglu, both of Los Alamos, N.Mex.

[73] Assignee: The Regents of the Universitiy of California, Los Alamos, N.Mex.

[21] Appl. No.: 09/141,502

[22] Filed: Aug. 28, 1998

[51] Int. Cl.[7] ................................ B32B 9/00; H01L 39/00

[52] U.S. Cl. .......................... 428/702; 505/238; 505/237; 505/473; 505/474; 428/930; 427/62

[58] Field of Search .................................... 505/238, 237, 505/210, 239, 473, 474; 428/930, 702; 427/62

[56] References Cited

U.S. PATENT DOCUMENTS 5,504,059 4/1996 Higaki et al. ........................... 505/210

FOREIGN PATENT DOCUMENTS 3-194979 8/1991 Japan .

OTHER PUBLICATIONS

Simon et al, Appl. Phys. lett. 53(26), pp. 2677–2679, Dec. 1988.

*Primary Examiner*—Roy V. King
*Attorney, Agent, or Firm*—Bruce H. Cottrell

[57] ABSTRACT

A thin film structure including a lanthanum aluminum oxide substrate, a thin layer of homoepitaxial lanthanum aluminum oxide thereon, and a layer of a nonlinear dielectric material thereon the thin layer of homoepitaxial lanthanum aluminum oxide is provided together with microwave and electro-optical devices including such a thin film structure.

13 Claims, 3 Drawing Sheets

FORMATION OF NONLINEAR DIELECTRIC FILMS FOR ELECTRICALLY TUNABLE MICROWAVE DEVICES

FIELD OF THE INVENTION

The present invention relates to electrically tunable devices based on nonlinear dielectric $SrTiO_3$, and more particularly to electrically tunable devices based on nonlinear dielectric $SrTiO_3$ using a homoepitaxial interlayer between the substrate and the dielectric film. This invention was made with government support under Contract No. W-7405-ENG-36 awarded by the U.S. Department of Energy. The government has certain rights in the invention.

BACKGROUND OF THE INVENTION

Electrically tunable microwave devices based on a $YBa_2Cu_3O_{7-x}/SrTiO_3$ multilayer have been extensively investigated. In those designs, advantage is taken of the dc electric field tunability of a nonlinear dielectric $SrTiO_3$ film and the very low conductor losses in high-temperature superconducting $YBa_2Cu_3O_{7-x}$ (YBCO) electrodes at cyrogenic temperatures below 90 K. For practical dc electric-field tunable microwave devices such as voltage-tunable resonators and voltage-tunable filters, it is desirable to grow high-quality dielectric $SrTiO_3$ thin films that have as large a dielectric tunability and as low dielectric losses as possible. Unfortunately, previous studies have shown that the effective loss tangent from a generic $YBCO/SrTiO_3$ multilayer is on the order of $10^{-2}$ which is much higher than a value of $10^{-4}$ observed in a single-crystal $SrTiO_3$.

Others have made efforts to look for new nonlinear dielectric materials and to use different dopants such as calcium and/or zinc in $SrTiO_3$ to reduce the loss tangent.

It has been shown that dielectric losses in $SrTiO_3$ film play the most important role in determining the performance of microwave devices. These dielectric losses include losses in the bulk of the $SrTiO_3$ film, the losses at the interface between the substrate and the $SrTiO_3$ film, and the losses at the interface between the $SrTiO_3$ film and the YBCO electrode.

Thus, one object of the present invention is to improve the microstructural properties of $SrTiO_3$ films so as to enhance the microwave properties of devices based on a YBCO/$SrTiO_3$ multilayer.

Another object of the present invention is to provide a thin homoepitaxial $LaAlO_3$, interlayer between a $LaAlO_3$ substrate and a $SrTiO_3$ film to reduce the defect density in the $SrTiO_3$ film.

Still another object of the present invention is to provide a coplanar waveguide device structure including $SrTiO_3$ as a nonlinear dielectric and superconducting YBCO as an electrode.

Yet another object of the present invention is to use a thin homo-epitaxial $LaAlO_3$ interlayer between a $LaAlO_3$ substrate and a YBCO film.

SUMMARY OF THE INVENTION

To achieve the foregoing and other objects, and in accordance with the purposes of the present invention, as embodied and broadly described herein, the present invention provides a thin film structure including a lanthanum aluminum oxide substrate, a thin layer of homoepitaxial lanthanum aluminum oxide thereon, and a layer of a nonlinear dielectric material thereon the thin layer of homoepitaxial lanthanum aluminum oxide.

The present invention also provides a thin film structure including a lanthanum aluminum oxide substrate, a thin layer of homoepitaxial lanthanum aluminum oxide thereon, and a layer of superconducting material thereon the thin layer of homoepitaxial lanthanum aluminum oxide.

The present invention also provides a method of making an improved microwave device by use of a thin layer of homoepitaxial lanthanum aluminum oxide situated directly between a lanthanum aluminum oxide substrate and a layer of nonlinear dielectric material, followed by a layer of superconducting material on the layer of nonlinear dielectric material.

DETAILED DESCRIPTION

Figure 1:
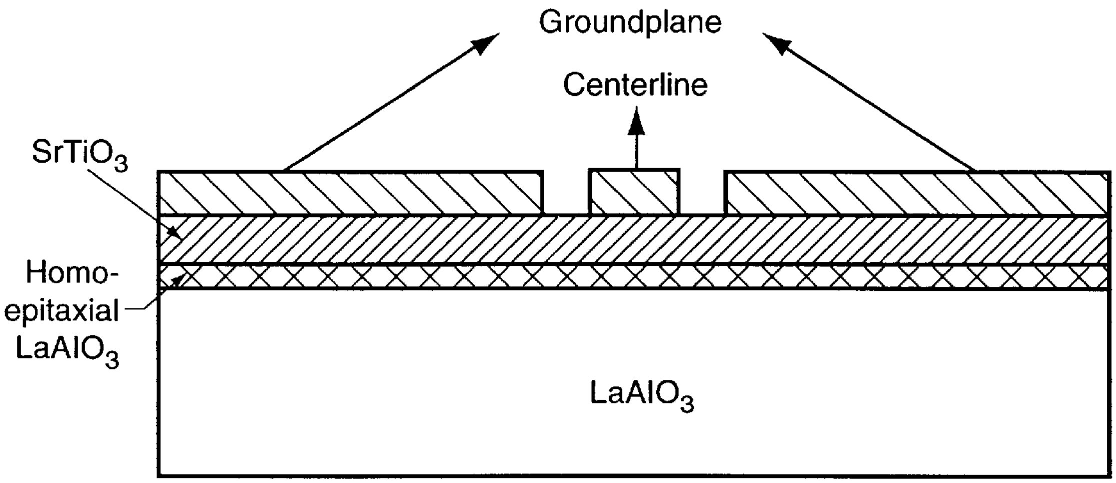
FIG. 1 shows a coplanar waveguide structure as constructed in the present invention.

The present invention is concerned with use of a homoepitaxial layer of a material such as $LaAlO_3$ on an underlying base substrate of the same material (i.e., $LaAlO_3$) to improve the properties of a multilayer structure including the underlying base substrate, the layer of the homoepitaxial material, and a subsequently deposited material of a different material than the underlying base substrate or layer of homoepitaxial material. The different material can be, e.g., a nonlinear dielectric material or a high temperature superconducting material. The present invention is also concerned with microwave devices employing such a multilayer structure. Such a microwave device can include a nonlinear dielectric material in combination with a high temperature superconducting material for a low temperature device. Similarly, such a microwave device may include a nonlinear dielectric material in combination, preferably with a conductive metal oxide as a buffer layer between the dielectric material and the contact electrodes, for a room temperature device. The present invention is also concerned with electro-optical devices employing such a multilayer structure of the same material.

The nonlinear dielectric material in the present invention can be strontium titanate ($SrTiO_3$), barium titanate ($BaTiO_3$), or can be a mixed titanate such as barium-strontium titanate ($Ba_xSr_{1-x}TiO_3$ often referred to as BSTO). Other nonlinear dielectric materials such as $PbZr_xTi_{1-x}O_3$ (PZT), $LiNbO_3$, $LiTaO_3$, La-modified PZT, and doped-BSTO (doping, e.g., with tungsten, magnesium oxide, calcium or zinc) may be used as well.

The underlying base substrate in the present invention can be lanthanum aluminum oxide ($LaAlO_3$), e.g., a single crystal $LaAlO_3$ substrate, or may be other materials such as MgO, $NdGaO_3$, $Sr_2AlTaO_6$, or $(LaAlO_3)_{0.3}(Sr_2AlTaO_6)_{0.7}$. The homoepitaxial layer upon the substrate is then of the same material as the substrate. Preferably, the base substrate is a $LaAlO_3$ substrate and the homoepitaxial layer is of $LaAlO_3$.

The high temperature superconducting material in the present invention can be any of the conventionally recognized materials such as yttrium barium copper oxide ($YBa_2Cu_3O_7$ or YBCO), or yttrium barium copper oxide substituted with a minor amount of an additional cation such as silver and the like. Generally such a minor amount will be up to about 10 percent by weight, more preferably from about 3 to about 7 weight percent. Other superconducting materials such as $GdBa_2Cu_3O_7$, $NdBa_2Cu_3O_7$, $SmBa_2Cu_3O_7$, $YbBa_2Cu_3O_7$, $ErBa_2Cu_3O_7$, may be used as well.

Conductive metallic oxides can be used as buffer layers between the dielectric material and metallic contact electrodes for room temperature devices in accordance with the present invention. The conductive metallic oxides can be of materials such as lanthanum strontium cobalt oxide (LSCO), strontium ruthenium oxide (SRO), ruthenium oxides ($RuO_x$), lanthanum strontium chromium oxide and the like.

The various material layers can be deposited by pulsed laser deposition or by other wee known methods such as evaporation, sputtering, or chemical vapor deposition. Pulsed laser deposition is the preferred deposition method.

In pulsed laser deposition, powder of the desired material, e.g., $LaAlO_3$ can be initially pressed into a disk or pellet under high pressure, generally above about 500 pounds per square inch (PSI) and the pressed disk then sintered in an oxygen-containing atmosphere for at least about one hour, preferably from about 12 to 24 hours. An apparatus suitable for the pulsed laser deposition is shown in Appl. Phys. Lett., 56, 578(1990), "effects of beam parameters on excimer laser deposition of $YBa_2Cu_3O_{7-x}$", such description hereby incorporated by reference.

Suitable conditions for pulsed laser deposition include, e.g., the laser, such as a XeCl excimer laser (20 nanoseconds (ns), 308 nanometers (nm)), targeted upon a rotating pellet of the desired material at an incident angle of about 45°. The target substrate can be mounted upon a heated holder rotated at about 0.5 revolutions per minute (rpm) to minimize thickness variations in the resultant film or layer. The substrate can be heated during the deposition at temperatures from about 600° C. to about 950° C., preferably from about 700° C. to about 850° C. An oxygen atmosphere of from about 0.1 millitorr (mTorr) to about 10 Torr, preferably from about 100 mTorr to about 250 mTorr, can be maintained within the deposition chamber during the deposition. Distance between the substrate holder and the pellet can generally be from about 4 centimeters (cm) to about 10 cm.

The rate of formation of the thin films or layers can be varied from about 0.1 Angstrom per second (Å/s) to about 200 Å/s by changing the laser repetition rate from about 1 hertz (Hz) to about 200 Hz. As laser beam divergence is a function of the repetition rate, the beam profile can be monitored after any change in repetition rate and the lens focal distance adjusted to maintain a constant laser energy density upon the target pellet. Generally, the laser beam can have dimensions of about 3 millimeters (mm) by 4 mm with an average energy density of from about 1 to about 5 joules per square centimeter ($J/cm^2$), preferably from about 1.5 to about 3 $J/cm^2$.

The present invention is more particularly described in the following examples, which are intended as illustrative only, since numerous modifications and variations will be apparent to those skilled in the art.

EXAMPLE 1

YBCO/$SrTiO_3$ multilayer structures with and without a homoepitaxial $LaAlO_3$ interlayer were deposited on $LaAlO_3$ substrates (100 orientation) by in situ pulsed laser deposition (PLD) using a 308 nm XeCl excimer laser. The homoepitaxial $LaAlO_3$ interlayer was grown on the $LaAlO_3$ substrates at temperatures from about 650° C. to about 785° C. with an oxygen pressure of about 200 milliTorr (mTorr) The $LaAlO_3$ interlayer had a thickness of from about 2 nanometers (nm) to about 25 nm. Following the growth of the homoepitaxial $LaAlO_3$ interlayer, the $SrTiO_3$ layer was deposited by switching the target without breaking vacuum on the deposition system. The deposition temperature for the $SrTiO_3$ layer was initially optimized and then maintained at 785° C. The thickness of the $SrTiO_3$ films was varied from about 0.4 microns ($\mu$m) to about 1.0 $\mu$m. A superconducting YBCO layer with a thickness of about 0.4 $\mu$m was then deposited at a substrate temperature of 775° C. The superconducting transition temperature of the YBCO on $SrTiO_3$ films with and without a homoepitaxial $LaAlO_3$ interlayer on $LaAlO_3$ substrates was above 88 K with a transition width of less than 0.6 K.

The microstructure of $SrTiO_3$ thin films on $LaAlO_3$ substrates with and without a homoepitaxial $LaAlO_3$ interlayer was examined by transmission electron microscopy (TEM) and high resolution electron microscopy (HREM) in cross-section in the [100] direction. Crosssectional TEM micrographs of the $SrTiO_3$ thin films on $LaAlO_3$ substrates with and without a homoepitaxial $LaAlO_3$ interlayer revealed the following. Antiphase boundaries, characterized by a contrast fluctuation across such boundaries, often initiated at the interface between the $SrTiO_3$ thin film and the $LaAlO_3$ substrate (or interlayer) and extended to the $SrTiO_3$ film surface. HREM observation on these defects indicated that most of the boundaries had a projected displacement across the boundaries of ½<110>. Similar boundaries were previously found in various epitaxially grown perovskite thin films such as YBCO, $BaTiO_3$and $KNbO_3$. While not wishing to be bound by the present explanation, it is believed that these boundaries could be formed as a result of non-perfect epitaxial growth. To make a qualitative comparison between the $SrTiO_3$ thin films on $LaAlO_3$ substrates with and without a homoepitaxial $LaAlO_3$ interlayer, the density of the planar defects present in the $SrTiO_3$ films was calculated. The calculation was done by counting the number of planar defects in the direction along the interface and dividing the number by the distance. Areas having similar thicknesses were used for analysis in order to reduce the possible projection effect. The results from several different areas over a distance of a few microns were averaged. The defect density was about 20 per micron for $SrTiO_3$ thin films on $LaAlO_3$ substrates with a homoepitaxial $LaAlO_3$ interlayer and about 50 per micron for $SrTiO_3$ thin films on $LaAlO_3$ substrates without a homoepitaxial $LaAlO_3$ interlayer. Similar results were observed for other samples with different homoepitaxial $LaAlO_3$ interlayers and $SrTiO_3$ thicknesses.

The HREM examination had found that the homoepitaxial $LaAlO_3$ interlayer had many more structural defects than either the single crystal $LaAlO_3$ substrate or the $SrTiO_3$ film grown on top. A cross sectional HREM micrograph of a $SrTiO_3$ thin film on a $LaAlO_3$ substrate with about a 25 nm thick homoepitaxial $LaAlO_3$ interlayer showed that the $SrTiO_3$ film had about the same value of planar defect density as the film examined by TEM. A number of structural defects, mainly planar defects, were visible in the homoepitaxial $LaAlO_3$ interlayer. The planar defect density in the homoepitaxial $LaAlO_3$ interlayer was about 10 times higher than that of the $SrTiO_3$ layer deposited on top. Most of the planar defects present in the $LaAlO_3$ interlayer were found to be terminated near the homoepitaxial $LaAlO_3$ interlayer and the $SrTiO_3$ film interface.

To assess the microwave losses of the epitaxial $SrTiO_3$ films with and without a homoepitaxial $LaAlO_3$ interlayer, a coplanar waveguide structure as shown in FIG. 1 was fabricated incorporating a 1 micron thick $SrTiO_3$ layer and a 0.4 micron thick superconducting YBCO electrode. The top YBCO layer was patterned by wet chemical etching. Gold contact pads (0.2 micron thick) were deposited on YBCO by rf sputtering and patterned by a lift-off technique. The finished devices were annealed at 450° C. in oxygen. The device had a centerline width of 20 microns and a gap width of 40 microns between the centerline and the groundplates. The device was designed and operated in the manner of the electrically tunable coplanar transmission line resonator as described by Findikoglu et al., Appl. Phys. Lett., vol. 66, pp. 3674–3676 (1995), wherein YBCO/STO bilayers were grown directly on [001] $LaAlO_3$ substrates, such details incorporated herein by reference.

Figure 2:
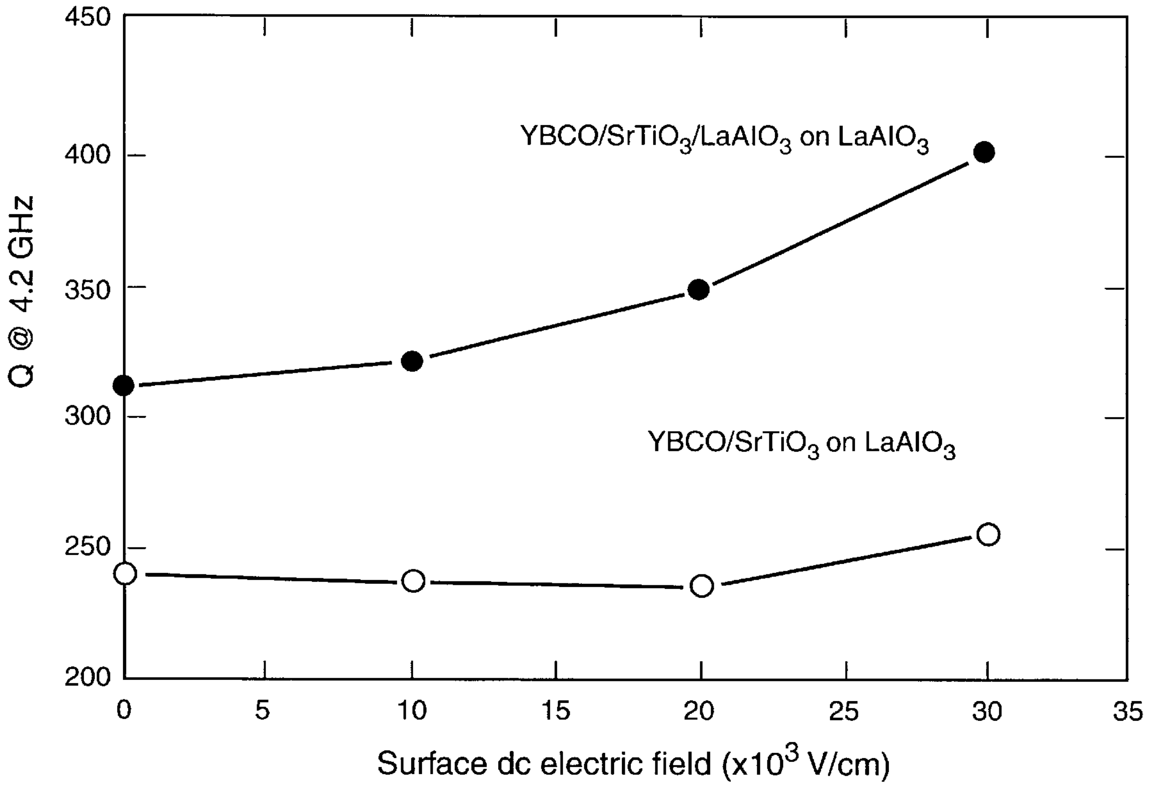
FIG. 2 shows the quality factor for a standing wave resonance at a microwave frequency of about 4.2 gigahertz (GHz) and at a temperature of 4 K, measured as a function of dc bias applied between the centerline and the groundplates.

FIG. 2 shows the quality factor for a standing-wave resonance at a microwave frequency of about 4.2 gigahertz (GHz) and at a temperature of 4 K, measured as a function of dc bias applied between the centerline and the groundplates. For a given voltage bias, the electric field amplitude decreases from the $SrTiO_3$ film surface to its interface with the substrate. Thus, the surface dc electric field used in the plot corresponds to the highest electric field in the $SrTiO_3$ film. As seen in FIG. 2, the quality factor of a YBCO/$SrTiO_3$ multilayer device using a homoepitaxial $LaAlO_3$ interlayer was improved by more than 50 percent at a surface electric field of $3\times10^4$ volts per centimeter (V/cm) in comparison to a conventional device without such an interlayer.

Figure 3:
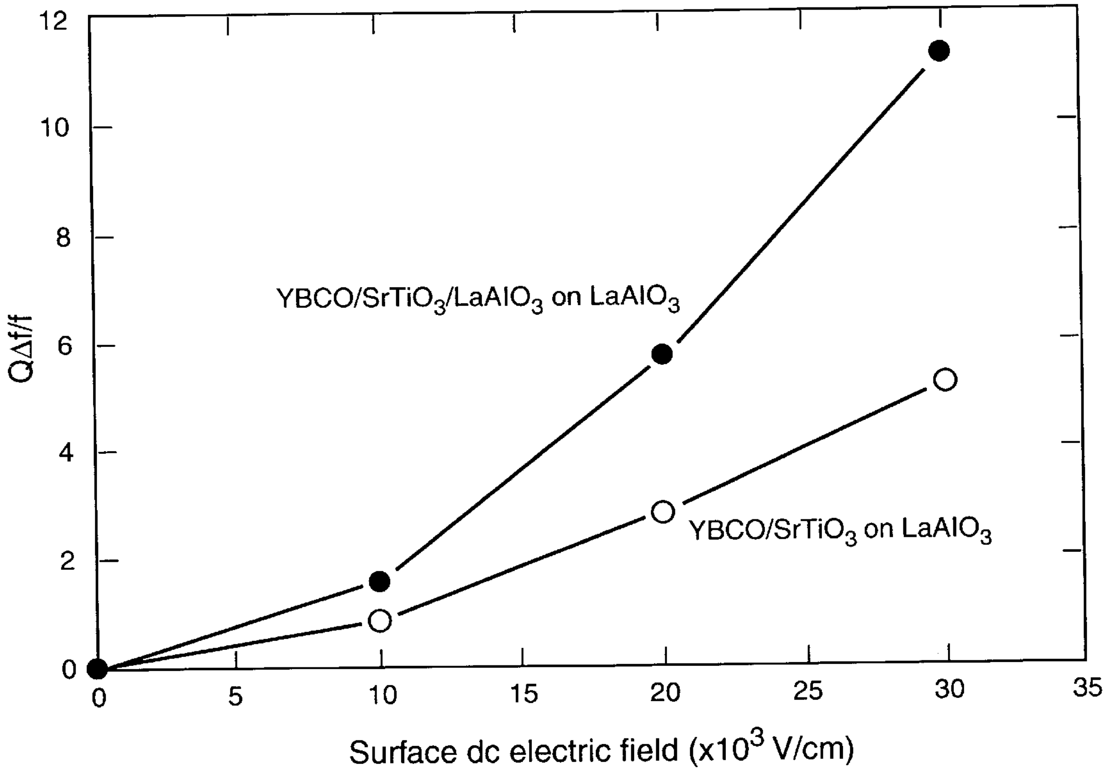
FIG. 3 shows the finesse factor at 4.2 GHz and 4 K as a function of dc bias for the voltage-tunable coplanar waveguide microwave resonators made from identically deposited $YBCO/SrTiO_3$ bilayers with and without a homoepitaxial $LaAlO_3$ interlayer on $LaAlO_3$ substrates.

Since the use of a homoepitaxial $LaAlO_3$ interlayer did not lead to any degradation in the dielectric tunability, the finesse factor had also improved by more than 50 percent for the same set of devices. FIG. 3 shows the finesse factor at 4.2 GHz and 4 K as a function of dc bias for the voltage-tunable coplanar waveguide microwave resonators made from identically deposited YBCO/$SrTiO_3$ bilayers with and without a homoepitaxial $LaAlO_3$ interlayer on $LaAlO_3$ substrates. Examination of the data in both FIG. 2 and FIG. 3 indicates that this approach provides a way to enhance the quality factor without sacrificing the dielectric tunability of the $SrTiO_3$ films. Reduction of the defect density in the epitaxial $SrTiO_3$ films by use of such a homoepitaxial $LaAlO_3$ interlayer can lead to improvement on the device performance at 4 K since the losses at very low temperatures are more likely to be dominated by the defects in $SrTiO_3$ films. Such epitaxial $SrTiO_3$ films show more single-crystal like properties as evident from a temperature dependent quality factor and dielectric tunability.

The present results demonstrate that introduction of a homoepitaxial $LaAlO_3$ interlayer between a nonlinear dielectric $SrTiO_3$ film and a $LaAlO_3$ substrate can achieve more than a two-fold reduction in areal defect density in $SrTiO_3$ thin films. The reduction of planar defect density in $SrTiO_3$ thin films is accompanied by reduction in microwave losses. Coplanar waveguide microwave resonators have been fabricated based on a multilayer structure of YBCO/$SrTiO_3$/$LaAlO_3$ substrates. Enhancement of finesse factor by 50 percent has been observed by incorporation of the homoepitaxial $LaAlO_3$ interlayer between a nonlinear dielectric $SrTiO_3$ film and a $LaAlO_3$ substrate.

EXAMPLE 2

A thin layer of YBCO (doped with 7 percent Ag) was deposited on $LaAlO_3$ substrates (100 orientation) by in situ pulsed laser deposition (PLD) using a 308 nm XeCl excimer laser with and without a homoepitaxial $LaAlO_3$ interlayer. The homoepitaxial $LaAlO_3$ interlayer was grown on the $LaAlO_3$ substrates at temperatures from about 650° C. to about 785° C. with an oxygen pressure of about 200 milliTorr (mTorr). The $LaAlO_3$ interlayer had a thickness of from about 2 nanometers (nm) to about 25 nm. Following the growth of homoepitaxial $LaAlO_3$ interlayer, the YBCO layer was deposited by switching the target without breaking vacuum on the deposition system. The deposition temperature for the YBCO layer was optimized and then maintained at 780° C. The thickness of the YBCO films varied from about 0.2 microns ($\mu$m) to about 0.6 $\mu$m. The superconducting transition temperature of the YBCO with a homoepitaxial $LaAlO_3$ interlayer on $LaAlO_3$ substrates was above 88 K with a transition width of less than 0.5 K. The superconducting YBCO thin films exhibited a critical current density over $10^6$ amperes per square centimeter (A/cm$^2$) at liquid nitrogen temperature.

Although the present invention has been described with reference to specific details, it is not intended that such details should be regarded as limitations upon the scope of the invention, except as and to the extent that they are included in the accompanying claims.

What is claimed is:

1. A thin film structure comprising a lanthanum aluminum oxide substrate, a thin layer of homoepitaxial lanthanum aluminum oxide thereon, and a layer of a nonlinear dielectric material thereon said thin layer of homoepitaxial lanthanum aluminum oxide.

2. The structure of claim 1 wherein said nonlinear dielectric material is selected from the group consisting of strontium titanium oxide, barium strontium titanium oxide and barium titanium oxide.

3. The structure of claim 1 wherein said nonlinear dielectric material is strontium titanium oxide.

4. The structure of claim 1 wherein said nonlinear dielectric material is barium titanium oxide.

5. The structure of claim 1 wherein said nonlinear dielectric material is barium strontium titanium oxide.

6. The structure of claim 1 further including a layer of high temperature superconducting material on the layer of nonlinear dielectric material.

7. The structure of claim 6 wherein said high temperature superconducting material is yttrium barium copper oxide.

8. The structure of claim 1 further including a layer of an electrode material on the layer of nonlinear dielectric material and a buffer layer between the layer of nonlinear dielectric material and the layer of electrode material.

9. The structure of claim 8 wherein said buffer layer is selected from the group consisting of lanthanum strontium cobalt oxide, strontium ruthenium oxide, and ruthenium oxides.

10. A thin film structure comprising a lanthanum aluminum oxide substrate, a thin layer of homoepitaxial lanthanum aluminum oxide thereon, and a layer of superconducting material thereon said thin layer of homoepitaxial lanthanum aluminum oxide.

11. The structure of claim 10 wherein said superconducting material is yttrium barium copper oxide.

12. A method of making a microwave device comprising:

forming a thin layer of homoepitaxial lanthanum aluminum oxide situated directly between a lanthanum aluminum oxide substrate and a layer of nonlinear dielectric material; and, forming a layer of superconducting material on the layer of nonlinear dielectric material.

13. The method of claim 12 wherein said nonlinear dielectric material is selected from the group consisting of strontium titanium oxide, barium strontium titanium oxide and barium titanium oxide and said superconducting material is yttrium barium copper oxide.

* * * * *